(12) United States Patent
Kozarsky et al.

(10) Patent No.: US 9,236,269 B2
(45) Date of Patent: Jan. 12, 2016

(54) FIELD EFFECT TRANSISTOR (FINFET) DEVICE WITH A PLANAR BLOCK AREA TO ENABLE VARIABLE FIN PITCH AND WIDTH

(71) Applicant: GLOBALFOUNDRIES Inc., Grand Cayman (KY)

(72) Inventors: Eric S. Kozarsky, Ballston Spa, NY (US); Shiv Kumar Mishra, Clifton Park, NY (US)

(73) Assignee: GlobalFoundries Inc., Grand Cayman (KY)

( * ) Notice: Subject to any disclaimer, the term of this patent is extended or adjusted under 35 U.S.C. 154(b) by 8 days.

(21) Appl. No.: 14/259,179

(22) Filed: Apr. 23, 2014

(65) Prior Publication Data

US 2015/0311085 A1    Oct. 29, 2015

(51) Int. Cl.
| | |
|---|---|
| H01L 21/336 | (2006.01) |
| H01L 21/8234 | (2006.01) |
| H01L 21/308 | (2006.01) |
| H01L 27/088 | (2006.01) |
| H01L 29/06 | (2006.01) |

(52) U.S. Cl.
CPC ........ H01L 21/3086 (2013.01); H01L 27/0886 (2013.01); H01L 29/0657 (2013.01)

(58) Field of Classification Search
CPC ............ H01L 21/845; H01L 21/76831; H01L 21/762; H01L 21/28556; H01L 21/28194; H01L 21/02271; H01L 21/02642; H01L 21/3148; H01L 21/67063; H01L 21/67069; H01L 21/8238; H01L 21/76202; H01L 21/467; H01L 21/308; H01L 21/02332; H01L 21/0228; H01L 21/823821; H01L 27/0924; H01L 27/1104; H01L 29/7831; H01L 29/66045
USPC ........ 438/197, 311, 700, 157, 283, 297, 430, 438/513, 9, 676, 678, 679, 680, 681, 706, 438/712, 745, 769, 798; 257/E21.006, 257/E21.014, E21.027, E21.043, E21.051, 257/E21.058, E21.115, E21.126, E21.127, 257/E21.134, E21.17, E21.206, E21.217, 257/E21.229, E21.231, E21.237, E21.259, 257/E21.267, E21.278, E21.293, E21.32, 257/E21.329, E21.332, E21.4, E21.421
See application file for complete search history.

(56) References Cited

U.S. PATENT DOCUMENTS

| | | | |
|---|---|---|---|
| 6,924,178 B2 | 8/2005 | Beintner | |
| 7,960,287 B2* | 6/2011 | Johnson et al. | ............... 438/703 |
| 8,183,159 B2 | 5/2012 | Furukawa et al. | |
| 8,673,165 B2 | 3/2014 | Raghunathan et al. | |
| 8,679,950 B2 | 3/2014 | Fumitake | |
| 8,928,083 B2* | 1/2015 | Chang et al. | .................. 257/350 |
| 8,981,493 B2* | 3/2015 | Cheng et al. | .................. 257/390 |
| 8,993,399 B2* | 3/2015 | Cheng et al. | .................. 438/268 |
| 2015/0145048 A1* | 5/2015 | Cheng et al. | ........ H01L 21/8238 |

* cited by examiner

*Primary Examiner* — David Nhu
(74) *Attorney, Agent, or Firm* — Williams Morgan, P.C.

(57) ABSTRACT

Approaches for providing a fin field effect transistor device (FinFET) with a planar block area to enable variable fin pitch and width are disclosed. Specifically, approaches are provided for forming a plurality of fins patterned from a substrate, the plurality of fins comprising: a first set of fins having a variable pitch and a variable width; and a second set of fins having a variable pitch and a uniform width, wherein the first set of fins is adjacent the second set of fins. In one approach, the first set of fins is patterned from the planar block area, which is formed over the substrate, and the second set of fins is formed using a sidewall image transfer (SIT) process.

20 Claims, 3 Drawing Sheets

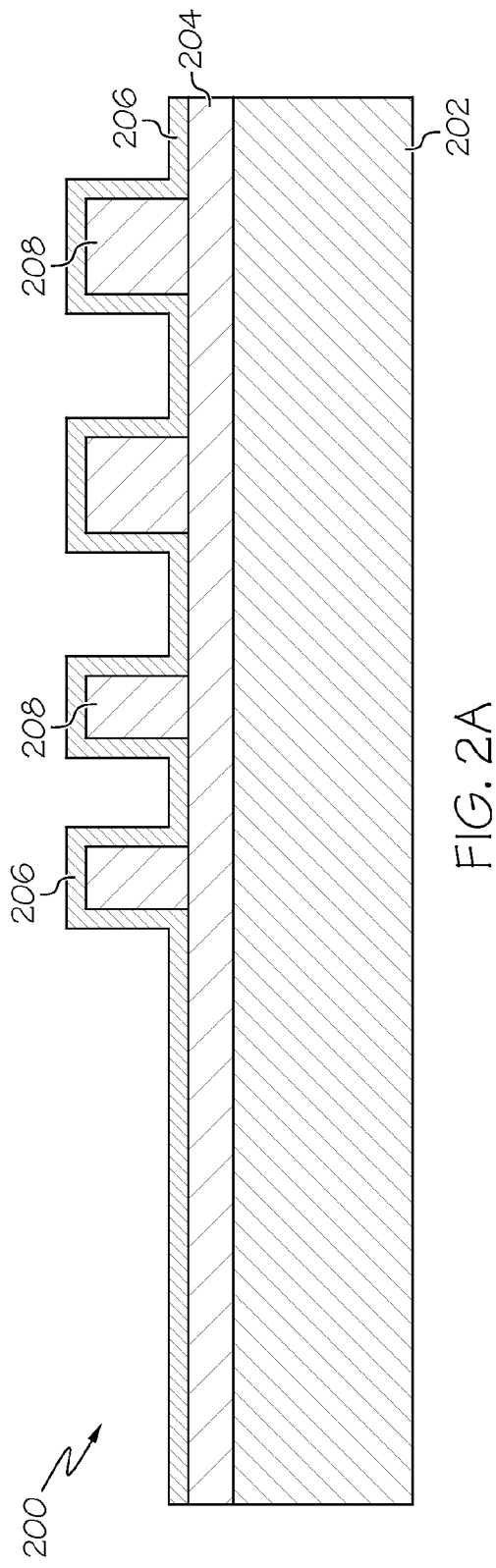
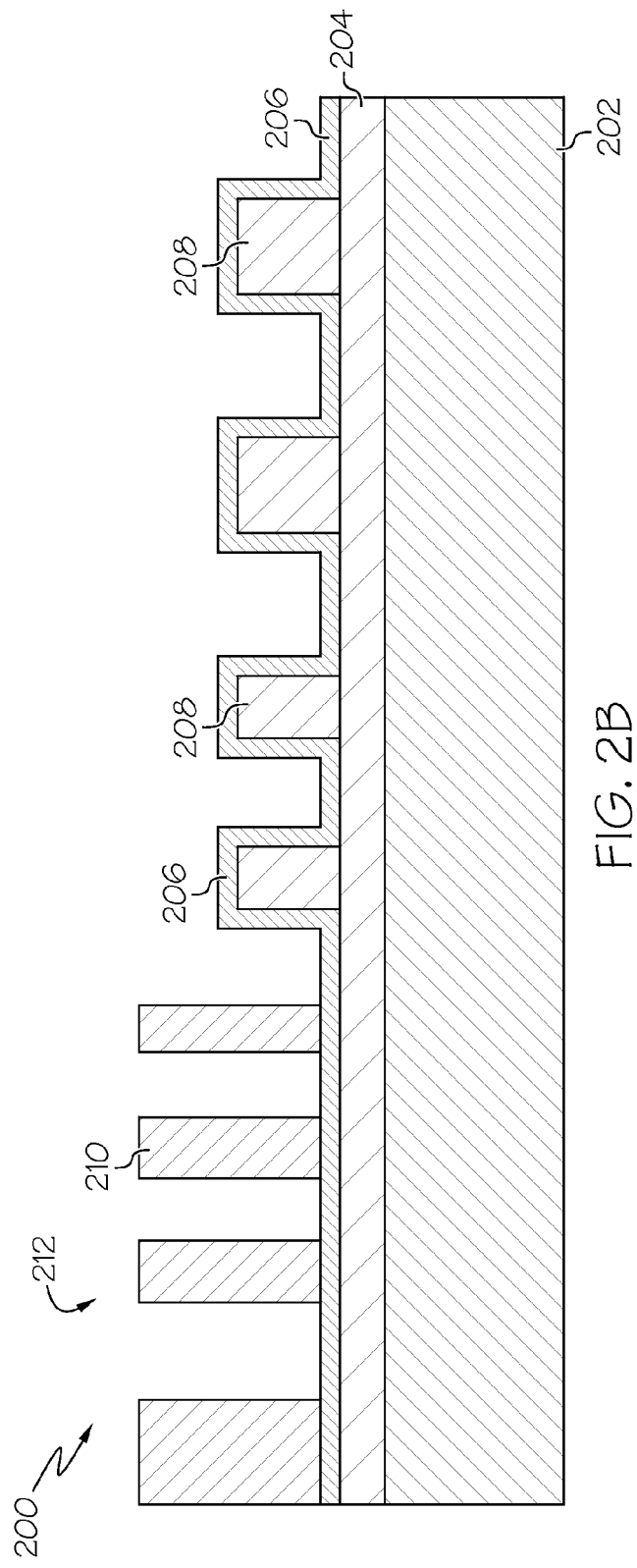

FIELD EFFECT TRANSISTOR (FINFET) DEVICE WITH A PLANAR BLOCK AREA TO ENABLE VARIABLE FIN PITCH AND WIDTH

BACKGROUND

1. Technical Field

This invention relates generally to the field of semiconductors, and more particularly, to forming a plurality of fins of a FinFET device using combined planar block and sidewall image transfer (SIT) processes.

2. Related Art

A typical integrated circuit (IC) chip includes a stack of several levels or sequentially formed layers of shapes. Each layer is stacked or overlaid on a prior layer and patterned to form the shapes that define devices (e.g., field effect transistors (FETs)) and connect the devices into circuits. In a typical state of the art complementary insulated gate FET process, such as what is normally referred to as CMOS, layers are formed on a wafer to form the devices on a surface of the wafer. Further, the surface may be the surface of a silicon layer on a silicon on insulator (SOI) wafer. A simple FET is formed by the intersection of two shapes, a gate layer rectangle on a silicon island formed from the silicon surface layer. Each of these layers of shapes, also known as mask levels or layers, may be created or printed optically through well-known photolithographic masking, developing, and level definition, e.g., etching, implanting, depositing, etc.

The FinFET is a transistor design that attempts to overcome the issues of short-channel effect encountered by deep submicron transistors, such as drain-induced barrier lowering (DIBL). Such effects make it harder for the voltage on a gate electrode to deplete the channel underneath and stop the flow of carriers through the channel—in other words, to turn the transistor off. By raising the channel above the surface of the wafer instead of creating the channel just below the surface, it is possible to wrap the gate around all but one of its sides, providing much greater electrostatic control over the carriers within it.

Device parameters of FinFETs are extremely sensitive to semiconductor fin thickness. In order to realize the full potential of a FinFET, the silicon fin must be very thin (e.g., on the same order of thickness as that of a fully-depleted SOI). Similarly, line width control problems during gate electrode definition for small devices can lead to performance degradation, power consumption control issues, and yield loss. Previously, lithographic techniques have been used to form device components (e.g., semiconductor fins for FinFETs, gate electrodes, etc.) in a substrate. Using photolithography, a feature can be printed directly into a photo-resist layer, and the image can be transferred into an underlying film. However, current state-of-the-art lithographic technology cannot adequately and efficiently satisfy the ever-increasing demand for smaller devices and device components. Thus, the requirement for very thin and replicable device components encourages the use of a SIT process to form such components.

SIT involves the usage of a sacrificial structure (e.g., a mandrel, typically composed of a polycrystalline silicon) and a sidewall spacer (such as silicon dioxide or silicon nitride, Si3N4, for example), having a thickness less than that permitted by the current ground rules, which is formed on the sides of the mandrel (e.g., via oxidization or film deposition and etching). After removal of the mandrel, the remaining sidewall spacer is used as a hardmask (HM) to etch the layer (s) below, e.g., with a directional reactive ion etch (RIE). Since the sidewall has a sublithographic width less than the ground rules, the structure formed in the layer below will also have a sublithographic width. In other uses, the sidewall may be used as a component in the desired structure (e.g., as a portion of the fins in a FinFET).

As shown by current art device 100 of FIG. 1, the SIT process inherently results in only a single fin width (W) for each of a plurality of fins 102, which controls the final channel width. As such, for some devices, multiple fins must be combined in parallel in order to achieve desired performance, with a shallow trench isolation (STI) 104 in areas where there are no fins. However, as more fins are added to device 100, the area of each transistor increases, which increases RC delays introduced due to metal routing involved in interconnections of multiple fins. Additionally, device stability decreases as more fins are used, especially for higher current devices at more advanced nodes (e.g., 10 nm and below).

SUMMARY

In general, approaches for providing a fin field effect transistor device (FinFET) with a planar block area to enable variable fin pitch and width are disclosed. Specifically, approaches are provided for forming a plurality of fins patterned from a substrate, the plurality of fins comprising: a first set of fins having a variable pitch and a variable width; and a second set of fins having a variable pitch and a uniform width, wherein the first set of fins is adjacent the second set of fins. In one approach, the first set of fins is patterned from the planar block area, which is formed over the substrate, and the second set of fins is formed using a sidewall image transfer (SIT) process.

One aspect of the present invention includes a method for forming a fin field effect transistor (FinFET) device, the method comprising: forming a plurality of fins patterned from a substrate, the plurality of fins comprising: a first set of fins having a variable pitch and a variable width; and a second set of fins having a variable pitch and a uniform width, wherein the first set of fins is adjacent the second set of fins.

Another aspect of the present invention includes a method for forming a fin field effect transistor (FinFET) device with a planar block area to enable variable fin pitch and width, the method comprising: forming a plurality of fins patterned from a substrate, the plurality of fins comprising: a first set of fins having a variable pitch and a variable width; and a second set of fins having a variable pitch and a uniform width, wherein the first set of fins is adjacent the second set of fins.

Yet another aspect of the present invention includes a fin field effect transistor (FinFET) device comprising: a plurality of fins patterned from a substrate, the plurality of fins comprising: a first set of fins having a variable pitch and a variable width; and a second set of fins having a variable pitch and a uniform width, wherein the first set of fins is adjacent the second set of fins.

BRIEF DESCRIPTION OF THE DRAWINGS

These and other features of this invention will be more readily understood from the following detailed description of the various aspects of the invention taken in conjunction with the accompanying drawings in which:

FIG. 2(A) shows a cross-sectional view of a semiconductor device having a hardmask, patterned mandrel layer, and spacer layer according to illustrative embodiments;

FIG. 2(B) shows a side cross-sectional view of the semiconductor device following formation of a patterned planar block over the substrate according to illustrative embodiments;

Figure 1:
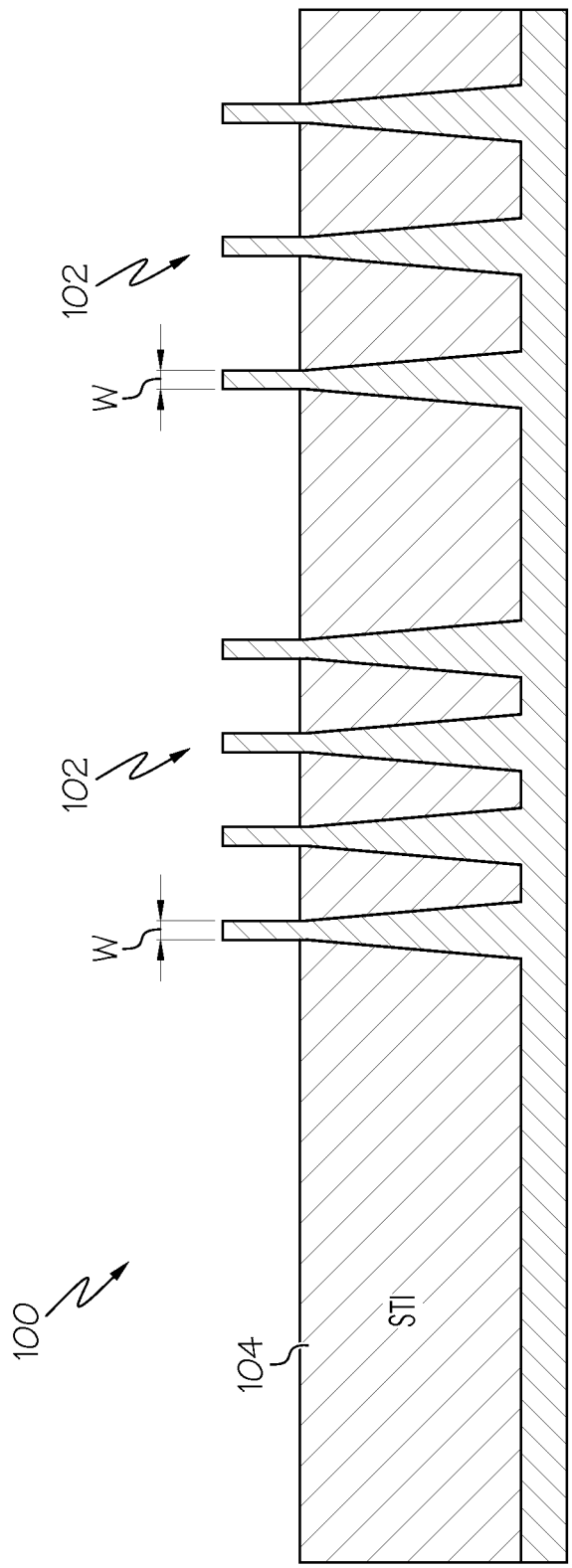
FIG. 1 shows a cross-sectional view of a prior art FinFET semiconductor device.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines, which would otherwise be visible in a "true" cross-sectional view, for illustrative clarity. Furthermore, for clarity, some reference numbers may be omitted in certain drawings.

DETAILED DESCRIPTION

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UH-VCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

As stated above, approaches for providing a fin field effect transistor device (FinFET) with a planar block area to enable variable fin pitch and width are disclosed. Specifically, approaches are provided for forming a plurality of fins patterned from a substrate, the plurality of fins comprising: a first set of fins having a variable pitch and a variable width; and a second set of fins having a variable pitch and a uniform width, wherein the first set of fins is adjacent the second set of fins. In one approach, the first set of fins is patterned from the planar block area, which is formed over the substrate, and the second set of fins is formed using a sidewall image transfer (SIT) process.

With reference again to the figures, FIGS. 2(a)-(d) demonstrate an approach for forming a plurality of fins of a FinFET device (hereinafter "device") according to illustrative embodiments of the invention. As shown in the cross-sectional view of FIG. 2(a), device 200 comprises a substrate 202, and a hardmask 204 formed over substrate 202. The term "substrate" as used herein is intended to include a semiconductor substrate, a semiconductor epitaxial layer deposited or otherwise formed on a semiconductor substrate, and/or any other suitable type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion of or the entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

In one embodiment, hardmask 204 may comprise silicon nitride (SiN), silicon dioxide (SiO2), or any other material(s) suitable as a hardmask, including silicon oxynitride (SiON), silicon oxycarbide (SiOC), and the like. Hardmask 204 can be prepared by PVD, CVD, spin coating, etc., depending on the material. It will be appreciated that hardmask 204 may comprise multiple stacked layers, and is not limited to the uniform layer shown.

Device 200 further includes a spacer layer 206 formed over a patterned mandrel layer 208. In various embodiments, mandrel layer 208 may comprise an inorganic, organic, and/or dielectric material such as amorphous silicon, polycrystalline silicon, or silicon oxide ($SiO_x$) where x is a number greater than zero, silicon nitride ($Si_3N_4$), silicon oxynitride (SiON), or the like. Hardmask 204 and mandrel layer 208 may be deposited using physical vapor deposition (PVD), CVD, plasma-improved chemical vapor deposition (PECVD), atmospheric pressure chemical vapor deposition (APCVD), low-pressure CVD (LPCVD), high density plasma CVD (HDPCVD), atomic layer CVD (ALCVD), spin coating (e.g., in the case that mandrel layer 208 is an organic material), and/or other suitable processes.

Although not specifically shown, it will be appreciated that mandrel layer 208 is patterned to form a set of openings therein, e.g., using a photo-lithography process or other lithographic process (e.g., electron beam lithography, imprint lithography, EUV lithography, etc.), and removed by a suitable etching process including a wet etch, dry etch, plasma etch, and the like.

Spacer layer 206 is then formed over patterned mandrel layer 208, including along the sidewalls of the patterned mandrel layer 208. As is known, spacer layer 206 provides a protective dielectric layer on the sidewalls of mandrel layer 208. In one embodiment, the material of spacer layer 206 is selected to provide a material that will not be substantially etched by the etchant that subsequently removes mandrel layer 208. Spacer layer 206 may comprise, for instance, silicon dioxide, silicon nitride, oxide, etc., and is formed using a sidewall image transfer (SIT) atomic layer deposition (ALD) and etch processes.

Next, as shown in FIG. 2(b), a planar block mask 210 is formed over substrate 202 in a planar block area 212 of device 200. It will be appreciated that in this embodiment, planar block mask 210 has three openings formed therein. However, this is meant as a non-limiting example and, as such, any number of openings and spacing between openings may be possible in various other embodiments.

Figure 2C:
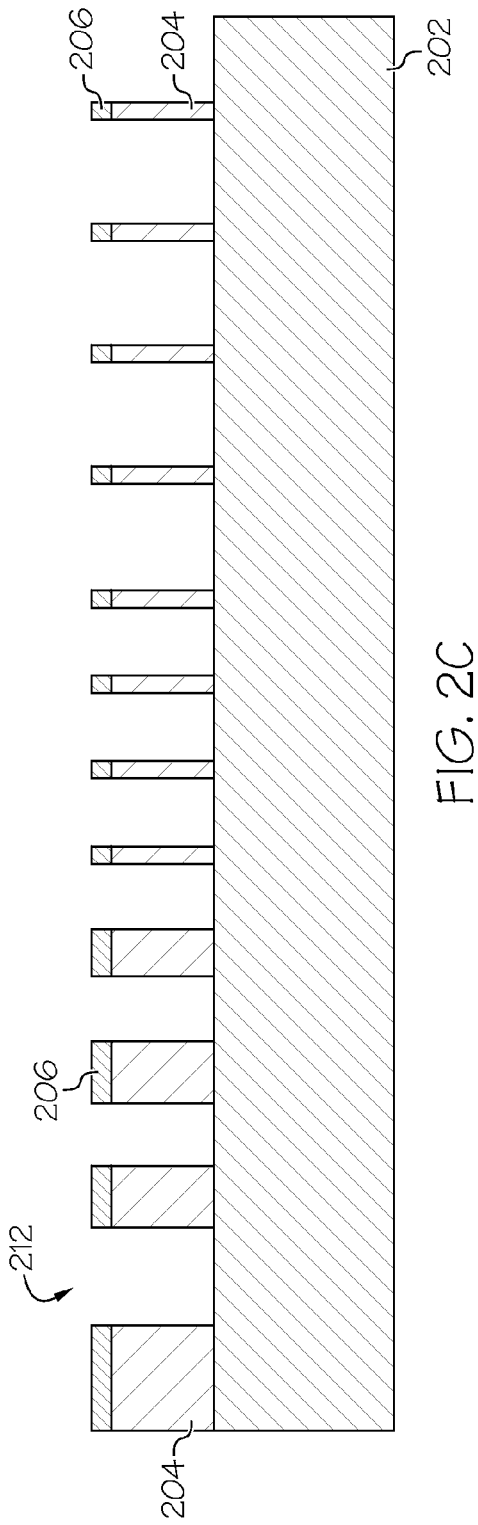
FIG. 2(C) shows a side cross-sectional view of the semiconductor device following an etch to the patterned mandrel and the hardmask according to illustrative embodiments.

Next, as shown in FIG. 2(c), hardmask 204, spacer layer 206, and patterned mandrel layer 208 are removed to form the structure of device 200. In one embodiment, spacer layer 206 is etched back to expose the top surfaces of patterned mandrel layer 208, wherein patterned mandrel layer 208 is then removed, leaving a portion of spacer layer 206 that was located on the sides of patterned mandrel layer 208. Furthermore, those portions of spacer layer 206 and hardmask 204 not protected by planar block mask 210 in planar block area 212 are removed, selective to substrate 202.

Figure 2D:
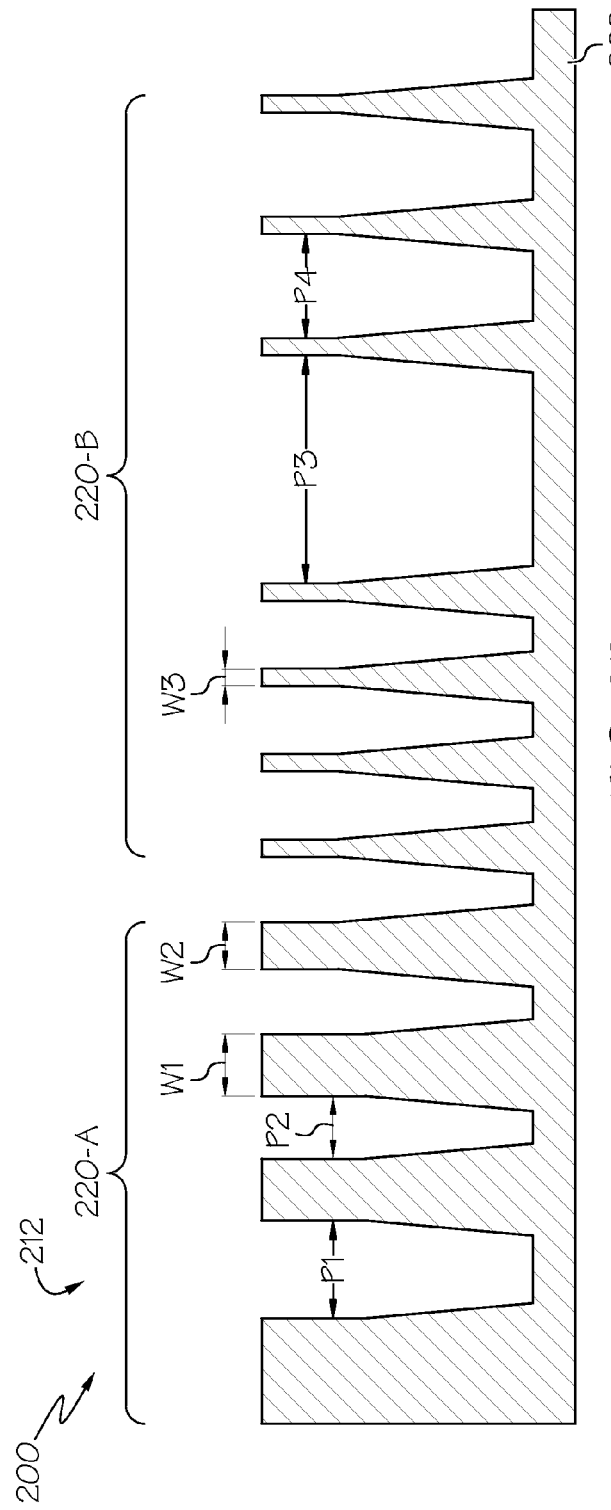
FIG. 2(D) shows a side cross-sectional view of the semiconductor device following formation of a plurality of fins of the semiconductor device according to illustrative embodiments.

Spacer layer 206 is then used with hardmask 204 to pattern one or more fins of device 200, as shown in FIG. 2(d). Specifically, a fin etch process is performed, whereby a set of openings are extended into substrate 202 to form a plurality of fins 220A-B. In one embodiment, substrate 202 is etched using a highly anisotropic dry etch (e.g., $SF_6/CH_2F_2/O_2/Ar$, modulating bias, pressure, and power, etc.). As shown, plurality of fins 220A-B includes a first set of fins 220-A in planar block area 212 having a variable pitch (e.g., different pitches P1 and P2) and a variable width (e.g., different widths W1 and W2), and a second set of fins 220-B having a variable pitch (e.g., P3 and P4) and a uniform width (e.g., W3). As used herein, pitch defines a relative distance between two adjacent fins, while width defines a thickness or cross-sectional dimension of each fin. It will be appreciated that resulting device 200 is representative only, and the exact parameters could be different in practice. For example, P2 could be larger than P1, or W2 could be larger than W1. Also, more or fewer fins could be included in other embodiments.

As shown, first set of fins 220-A is formed adjacent second set of fins 220-B and, in this embodiment, a width of each of set of first fins 220-A is greater than a width of each of set of second fins 220-B. Utilizing planar block area 212 allows for variable width fins for first set of fins 220-A, while still utilizing the SIT process to form second set of fins 220-B. In place of utilizing multiple minimum CD fins for high current devices, as in the current art, a wider CD fin (e.g., of first fins 220-A) can be used for greater stability. In other embodiments, multiple wide fins could still be combined as needed to allow for FinFET benefits with a more stable structure.

It will be appreciated that at least the following benefits are achieved by device 200 and the associated approaches described herein. Device 200 reduces the area of each transistor by minimizing the number of fins required for a given effective current ($I_{eff}$), reduces RC delays introduced due to metal routing involved in interconnections of multiple fins, provides a more stable device as less fins are used, provides increased stability for higher current devices at more advanced nodes (e.g., 10 nm and below), and allows easy integration with current FinFET technology, including integration of FinFET transistors with varying widths. Furthermore, the planar block has been applied to allow for the preservation of the original Si surface, and implementing the planar block structure allows for structures which are of larger dimensions than the SIT formed fin(s).

In various embodiments, design tools can be provided and configured to create the datasets used to pattern the semiconductor layers as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided approaches for forming a fin field effect transistor (FinFET) device having a planar block area to enable variable fin pitch and width. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a fin field effect transistor (FinFET) device, the method comprising:
    forming a plurality of fins patterned from a substrate, the plurality of fins patterned comprising:
        a first set of fins having a variable pitch and a variable width; and
        a second set of fins having a variable pitch and a uniform width, wherein the first set of fins is adjacent the second set of fins.

2. The method according to claim 1, forming the plurality of fins comprising patterning the first set of fins from a planar block area of the substrate.

3. The method according to claim 1, forming the plurality of fins comprising patterning the second set of fins using a sidewall image transfer (SIT) process.

4. The method according to claim 2, forming the plurality of fins comprising:
    depositing a hardmask over the substrate;
    forming a patterned mandrel layer over the hardmask;
    forming a spacer layer over the patterned mandrel layer; and
    forming a planar block mask over the planar block area of the substrate.

5. The method according to claim 4, further comprising patterning the planar block mask.

6. The method according to claim 1, forming the spacer layer comprising depositing the spacer layer using an atomic layer deposition.

7. The method according to claim 1, the substrate and the plurality of fins comprising silicon.

8. The method according to claim 1, wherein a width of each of the first set of fins is greater than a width of each of the second set of fins.

9. A method for forming a fin field effect transistor (FinFET) device having a planar block area to enable variable fin pitch and width, the method comprising:
    forming a plurality of fins patterned from a substrate, the plurality of fins patterned comprising:
        a first set of fins having a variable pitch and a variable width; and
        a second set of fins having a variable pitch and a uniform width, wherein the first set of fins is adjacent the second set of fins.

10. The method according to claim 9, forming the plurality of fins comprising patterning the first set of fins from a planar block area of the substrate.

11. The method according to claim 9, forming the plurality of fins comprising patterning the second set of fins using a sidewall image transfer (SIT) process.

12. The method according to claim 10, forming the plurality of fins comprising:
    depositing a hardmask over the substrate;
    forming a patterned mandrel layer over the hardmask;
    forming an spacer layer over the patterned mandrel layer; and
    forming a planar block mask over the planar block area of the substrate.

13. The method according to claim 12, further comprising patterning the planar block mask.

14. The method according to claim 9, forming the spacer layer comprising depositing the spacer layer using an atomic layer deposition.

15. The method according to claim 9, the substrate and the plurality of fins comprising silicon.

16. The method according to claim 9, wherein a width of each of the first set of fins is greater than a width of each of the second set of fins.

17. A fin field effect transistor (FinFET) device comprising:
    a plurality of fins patterned from a substrate, the plurality of fins patterned comprising:
        a first set of fins having a variable pitch and a variable width; and
        a second set of fins having a variable pitch and a uniform width, wherein the first set of fins is adjacent the second set of fins.

18. The FinFET device of claim 17, the first set of fins patterned from a planar block area of the substrate.

19. The FinFET device of claim 17, the substrate and the plurality of fins comprising silicon.

20. The FinFET device of claim 17, wherein a width of each of the first set of fins is greater than a width of each of the second set of fins.

* * * * *